United States Patent [19]

Propst et al.

[11] 4,120,422
[45] Oct. 17, 1978

[54] SYSTEM FOR STORING AND TRANSPORTING FLAT BOARD-LIKE ELEMENTS

[75] Inventors: Robert L. Propst; Paul L. Propst, both of Ann Arbor, Mich.

[73] Assignee: Herman Miller, Inc., Zeeland, Mich.

[21] Appl. No.: 740,054

[22] Filed: Nov. 8, 1976

[51] Int. Cl.² ............................................... B65G 1/04
[52] U.S. Cl. .......................................... 221/88; 74/28;
211/40; 214/8.5 R; 312/19
[58] Field of Search .................... 221/88, 112; 211/40;
312/15–19; 40/78.07; 74/129, 126, 28; 214/8.5

[56] References Cited

U.S. PATENT DOCUMENTS

| | | | |
|---|---|---|---|
| 1,480,939 | 1/1924 | Hand | 312/17 |
| 1,815,830 | 7/1931 | Carlisle | 211/40 X |
| 3,107,816 | 10/1963 | Teague et al. | 221/88 |
| 3,596,526 | 8/1971 | Gribble | 74/110 |

*Primary Examiner*—Robert B. Reeves
*Assistant Examiner*—Francis J. Bartuska

*Attorney, Agent, or Firm*—Olsen and Stephenson

[57] ABSTRACT

A system for storing and transporting flat board-like elements of predetermined thickness, such as printed circuit boards, comprising a rack for storing and transporting the boards and apparatus for feeding boards to and removing boards from the rack. The rack comprises a plurality of upright partition members mounted on a frame in a uniformly spaced relation so as to define a plurality of side-by-side stalls each of a width adequate to accommodate a board-like element in an upright storage position. Supports associated with the partitions support a plurality of board-like elements in the stalls so that the rack can be moved without the board-like elements falling off. The elements are edgewise accessible in the stalls and a pivoted body member is on the rack in a novel manner which enables it to function as a ratcheting apparatus movable successively from stall to stall for the purpose of moving the elements therein in directions to facilitate removal thereof from the stall. The body member also facilitates loading of the stalls.

7 Claims, 13 Drawing Figures

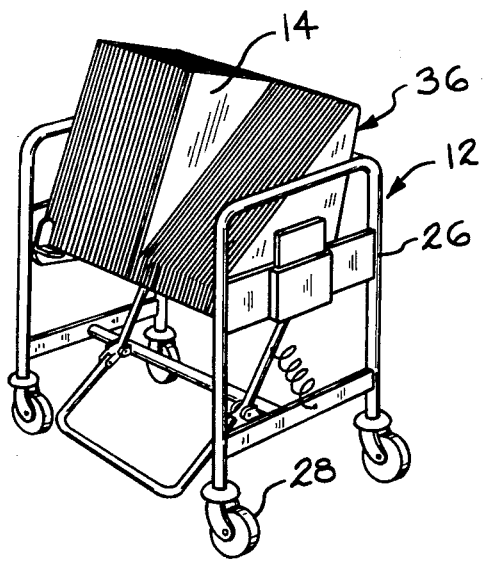
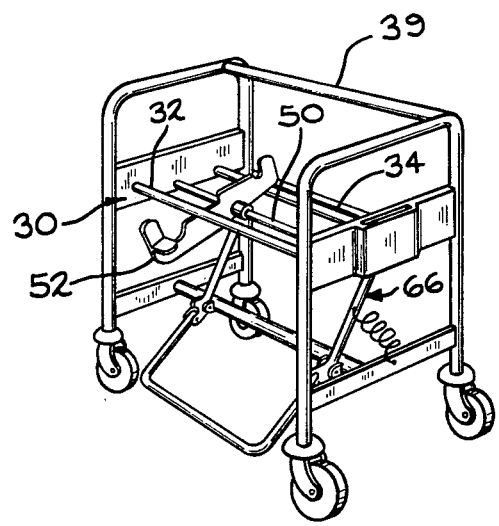
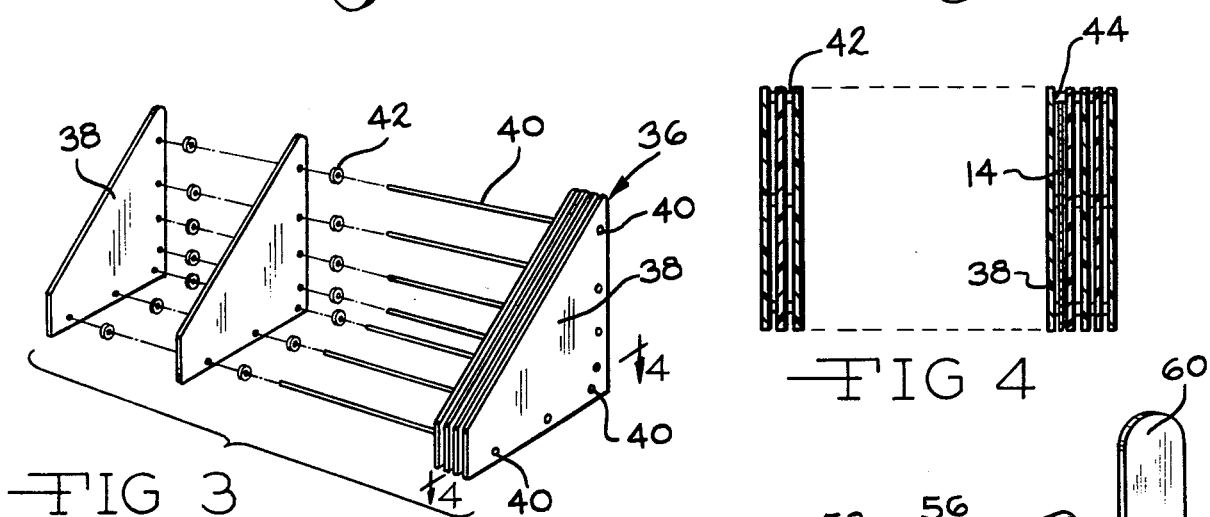
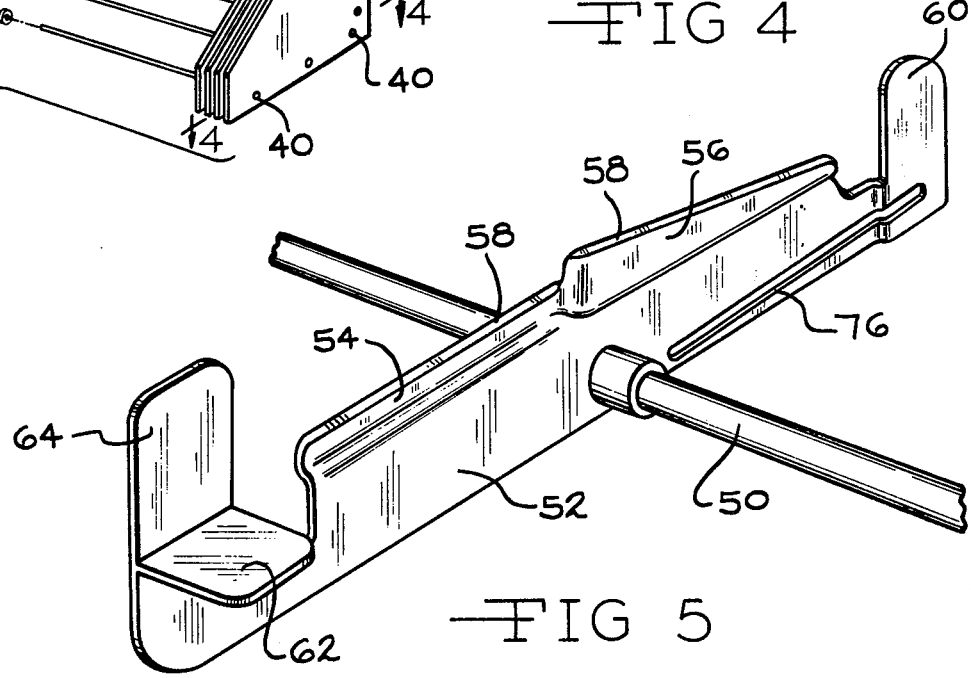

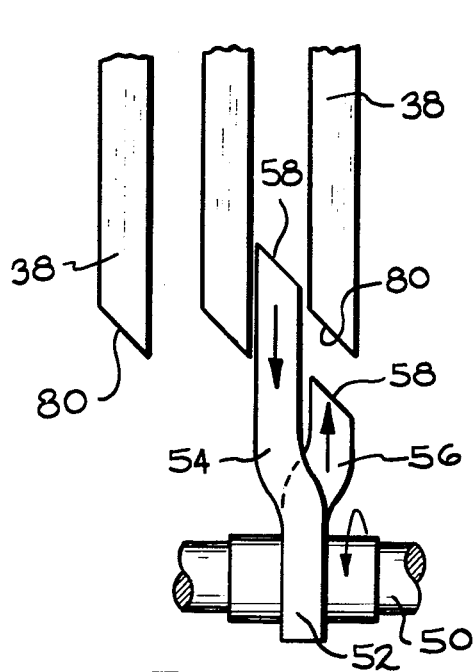
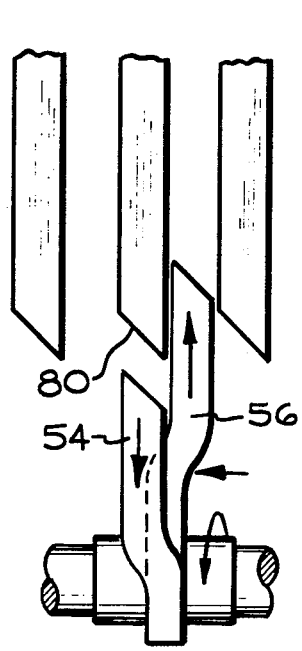
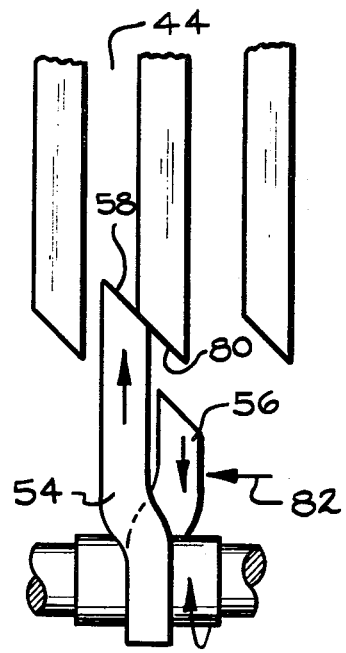
FIG. 6      FIG. 6A      FIG. 6B
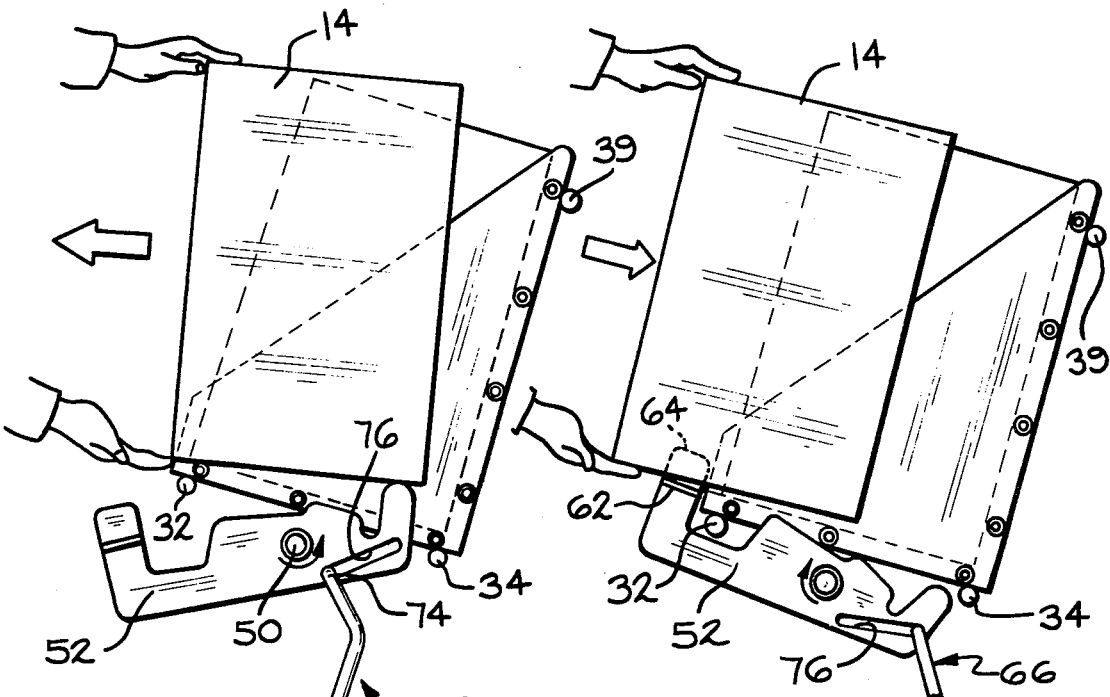
FIG. 7      FIG. 8

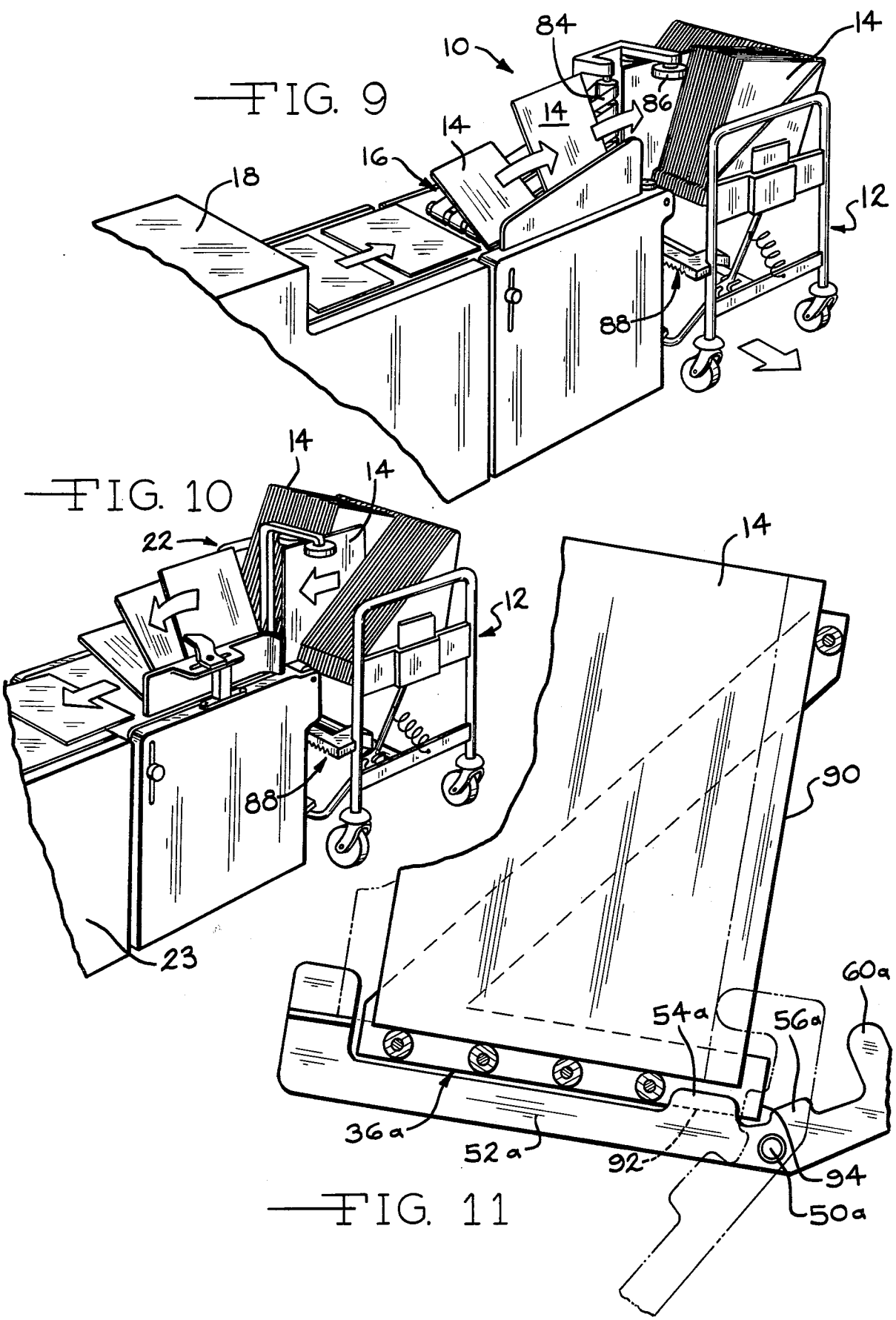

SYSTEM FOR STORING AND TRANSPORTING FLAT BOARD-LIKE ELEMENTS

BACKGROUND OF THE INVENTION

An efficient manufacturing or storage facility for flat board-like elements of predetermined thickness, such as printed circuit boards, requires an efficient material handling system for transporting the boards between various work stations and for storing the elements between work stations. Such a material handling system, heretofore unavailable, must provide fast, easy manual handling of the elements and must have a capability for handling elements of various sizes. Furthermore, such a system should require no special attachments for the elements or require any modification of the elements and must provide for compact storage of the elements in a readily available space. In addition, such a system should have a capability for interfacing with mechanical element loaders and unloaders but must also be readily manually loadable and unloadable. It is an object of the present invention, therefore, to provide a system of the above described type which accomplishes the above described objectives.

SUMMARY OF THE INVENTION

The system of this invention consists of a rack for storing and transporting flat board-like elements and a mechanism for feeding the elements into supported positions on the rack and for removing the elements from the rack. The rack consists of a main frame, a plurality of upright partition members mounted on the frame in a uniformly spaced relation so as to define a plurality of side-by-side stalls, and a body member pivotally mounted on the frame at a position below the stalls to facilitate loading and unloading of the rack. Supports associated with the partition members support the board-like elements in the stalls in cradled positions in which the elements are edgewise accessible. The body member is pivotally mounted on the frame below the stalls so that it can be moved into a stall into engagement with the edge of an element therein for the purpose of moving the element in a direction to facilitate its removal from the stall. The body member is also configured so as to facilitate loading of elements into the stalls.

The body member is pivotally mounted on a shaft carried by the frame and is provided with a pair of particularly configured edge surfaces disposed on opposite sides of the shaft and offset in the direction of the shaft axis. These edge surfaces cooperate with similarly configured edge surfaces on the partition members so that when the body member is moved back and forth, on the shaft, it will be ratcheted in one direction axially of the shaft. This enables successive ejection of board-like elements from the stalls in the rack. A foot pedal operated lever mechanism facilitates back and forth ratcheting movement of the body member.

The material handling system of this invention thus provides an improved rack apparatus in which a plurality of side-by-side board-like elements are stored in generally parallel positions to facilitate fast, easy, manual handling of the elements between work stations. By virtue of the configuration of the partition members on the rack, which are generally triangular, boards of various sizes can be handled without any special attachments or modifications. The elements are stored compactly in primarily vertical space in a very readily available location to facilitate their accessibility. Furthermore, this arrangement enables the rack to interface with a desired loading or unloading mechanism.

Further objects, features, and advantages of the invention will become apparent from a consideration of the following description, the appended claims, and the accompanying drawing, in which;

FIG. 1 is a perspective view of the rack for storing and transporting flat board-like elements in the system of this invention, showing a plurality of elements in supported positions on the rack;

FIG. 2 is a perspective view of the rack shown in FIG. 1, with the boards and the support unit therefor removed from the rack;

FIG. 3 is an exploded perspective view of the storage unit in the rack which forms a part of the system of this invention;

FIG. 4 is a sectional view of the storage unit as seen from line 4—4, FIG. 3;

FIG. 5 is a fragmentary perspective view illustrating the pivotally mounted body member in the rack of FIG. 1;

FIGS. 6, 6A, and 6B are fragmentary diagrammatic views illustrating the manner in which the body member shown in FIG. 5 cooperates with the partitions in the rack to provide for ratcheting the body member in one direction on the rack;

FIG. 7 is a diagrammatic view illustrating the manual removal of a board-like element from the rack of this invention;

FIG. 8 is a view like FIG. 7 illustrating a board-like element being loaded onto the rack in the system of this invention;

FIG. 9 is a perspective view illustrating a rack feeding mechanism interfaced with the rack of this invention;

FIG. 10 is a view like FIG. 9 showing an element unloading mechanism interfaced with the rack of this invention; and FIG. 11 is a fragmentary vertical sectional view of a modified form of the rack of this invention.

With reference to the drawing, the system of this invention, indicated generally at 10, is shown in FIGS. 9 and 10 as including a portable rack 12 for storing and transporting flat board-like elements of predetermined thickness, such as printed circuit boards 14 which are of generally rectangular shape. The boards 14 are commonly used in the manufacture of printed circuits and are shown in FIG. 9 in stored positions on the rack 12 and in positions being fed by a rack feeding mechanism 16 from a work station 18. In FIG. 10, apparatus 22 is shown for removing boards 14 from the rack 12 and feeding the removed boards 14 to a work station 23.

As shown in FIG. 1, the rack 12 consists of a main frame 26 having castered support wheels 28. Intermediate its upper and lower ends, the frame 26 is provided with a support platform 30 consisting of front and rear support tubes 32 and 34, respectively, the front tube 32 being elevated relative to the rear tube 34 for a purpose to appear presently. A board support unit 36 consisting principally of a plurality of upright partition members 38 which are generally triangular in shape, is supported on the platform 30 and rests against a rear frame member 39 in the rack frame 26. As shown in FIGS. 3 and 4, long connecting bolts 40 are extended through the partition members 38 and tubular spacers 42 are supported on the bolts 40 at positions between the partitions 38 so as to provide for a parallel arrangement of the partitions 38 in a uniformly spaced relation.

As shown in FIG. 3, the bolts 40 are all located adjacent the lower and rear edges of the partitions 38 so as to form supports for the bottom and rear edges of the board members 14 when they are supported on the unit 36 as shown in FIG. 1. The spaces 44 between adjacent partition members 38 form stalls which are of the width only slightly greater than the width of the boards 14 so as to accommodate the boards 14 therein in supported positions on the spacers 42. The disposition of the support tube 32 above the support tube 34 provides for the boards 14 being supported in rearwardly inclined positions on the spacers 42, as shown in FIGS. 7 and 8, to thereby preclude the boards 14 from accidently falling off the rack 12 during movement thereof.

A support shaft 50 is positioned on the frame 26 at a position below and substantially parallel to the support rods 32 and 34. The shaft 50 constitutes a pivotal support for a lever shape body member 52 (FIGS. 5 and 7) which is operable in a manner shown in FIG. 7 to facilitate removal of boards 14 from the rack 12 and operates as shown in FIG. 8 to facilitate the loading of boards 14 onto the rack 12. As shown in FIG. 5, the body member 52 is provided on opposite sides of the shaft 50 with a pair of upwardly extending projections 54 and 56 which terminate in edge surfaces 58 that are inclined with respect to the axis of the shaft 50. The projections 54 and 56 are spaced apart in a direction axially of the shaft 50 a distance less than the width of a stall 44.

The body member 52 is pivotally movable on the shaft 50 between the pair of positions, illustrated, respectively, in FIGS. 7 and 8. In one position, illustrated in FIG. 7, a projection 60 on the rear end of the body member 52 projects into a stall 44 into engagement with the lower edge of a board 14 and moves the board 14 upwardly and forwardly to a position out of alignment with the other board members 14 supported on the rack 12 to a position in which the board 14 can be readily grasped for removal from the rack 12, as illustrated in FIG. 7. In a second position of the body member 52, illustrated in FIG. 8, a transverse projection 62 on the front end of the body member 52 is positioned in substantial alignment with the spacers 42 which support the lower edge of a board 14. In this position, the projection 62 facilitates the manual sliding of a board 14 into a stall 44 to a supported position on the spacers 42, as shown in FIG. 8. During such movement, a projection 64 which extends upwardly from one edge of the projections 62 guides one side of the board 14 so as to further facilitate loading of the board 14 into a stall 44.

A foot pedal actuated lever assembly 66 (FIG. 7) is connected to the body member 52 to facilitate movement thereof between the positions shown in FIGS. 7 and 8. The assembly 66 consists of a lever 68 connected to a foot pedal 70 and pivotally supported on a pivot assembly 72 secured to the frame 26, is positioned at its upper end 74 in a slot 76 formed in the body member 52. A tension spring 78, connected at one end to the lever 68 and at the opposite end to the frame 26, biases the lever 68 to the position shown in FIG. 8 in which the projection 60 is in a clearance relation with the partition members 38 and the projection 62 is in a guiding position. When it is desired to move the body member 52 to the FIG. 7 position, foot pressure is applied to the pedal 70, as shown in FIG. 7, so as to move the lever 52 from the FIG. 8 position to the FIG. 7 position in which the projection 60 extends into a stall 44 so as to eject the circuit board 14 therein.

As shown in FIG. 5, the projections 54 and 56 on the body member 52 are transversely off-set. This relationship is diagrammatically llustrated in FIGS. 6, 6A, and 6B. As shown therein, the lower edges of the stall partitions 38 are formed with surfaces 80 which are inclined, similarly to the surfaces 58, with respect to the axis of the shaft 50. As a result, when a projection surface 58 on the body member 52 is moved upwardly into engagement with a partition surface 80 and then force is applied to the body member 52 so as to continue to urge the surface 58 upwardly, as shown in FIG. 6B, the reaction force of the partition 38 on the body member 52 has a component that is parallel to the axis of the shaft 50, as illustrated by the arrow 82 in FIG. 6B. As a result, the reaction force of the partition 38 on the surface 58 will move the body member 52 to a position in which the projection 56 will move into the left hand stall 44 in FIG. 6B.

This ratcheting action of the body member 52 is best understood by first assuming a position of the body member 52 as shown in FIG. 6 and movement of the member 52 in a counterclockwise direction as viewed in FIG. 7, as indicated by the arrows in FIG. 6. When a projection 54 is being moved in a direction to withdraw it from a stall 44 (FIG. 6), the projection 56 is being moved in a direction to engage an inclined partition surface 80 so as to move the projection 56 into the stall 44 which has just been vacated by the projection 54.

This movement of projection 56 moves the projection 54 into substantial alignment with the next partition 38 to the left, as shown in FIG. 6A. Subsequent movement of the body member 52 in a direction to move the projection 54 upwardly (FIG. 6B) will move the projection 54 into the left most stall 44, as previously described. Thus, rotation of body 52 has caused it to move to the left one stall 44 between the FIG. 6 and FIG. 6B positions. This ratcheting action of the body member 52 that is obtained by virtue of the inclined surfaces 58 and 80 enables the body member 52 to be moved in one direction lengthwise of the shaft 50 so as to successively eject, or facilitate the removal of, the boards 14 from all of the stalls 44.

In the use of the system 10, the board storage unit 36 is positioned on the rack 12, as shown in FIG. 1, so that the rack 12 can function continuously to store and transport board elements 14. If desired, the rack 12 can be moved to a position adjacent a work station 18 where a board feeding mechanism 16, consisting of a plurality of motor driven endless belts 84 which move the boards 14 from horizontal positions to upright positions in which they are guided by a guide roller assembly 86, moves the boards 14 onto the horizontal projection 62 on the body member 52 and into the stalls 44. An automatic drive mechanism, indicated generally at 88, and the details of which form no part of present invention, is associated with the feeding assembly 16 and the rack 12 for indexing the rack 12 so as to successively align stalls 44 with the upright boards 14 coming off the feeding mechanism 16. Similarly, the rack 12 can be positioned adjacent a board unloading assembly 22 (FIG. 10) which is operable in cooperation with the body member 52 and the lever assembly 66 to provide for a successive unloading of boards 14 from the rack 12. The unloading assembly includes the endless belts 84 and guide roller assembly 86 heretofore described which are operated in a reverse direction, relative to the direction in which they are operated to load the rack 12, when the rack 12 is being unloaded. Similarly, the rack indexing assembly 88 is operated in a reverse direction. In any event, the construction of the rack 12 and the operation of the body member 52 to successively move between stalls 44 to facilitate loading and unloading of boards 14 from the storage unit 36 on the rack 12 facilitates handling, transporting, and storage of the boards 14.

A modified form of storage unit and associated body member are illustrated in FIG. 11 in which like numerals with the letter suffix "a" are used to designate like parts on the unit 36 and body member 52. The body member 52a has a rear end projection 60a which engages the rear edge 90 of a circuit board 14 in order to eject the circuit board 14 from the storage unit 36a. The body member 52a is pivotally supported on a shaft 50a and has axially offset projections 54a and 56a located on opposite sides of the shaft 50a, the important distinction being that the bottom and rear edge portions 92 and 94, respectively, of the partition members 38a are inclined so as to form the surfaces 80 which coact with the inclined surfaces 58 on the projections 54a and 56a in order to achieve ratcheting movement of the body member 52a. In all other respects, this structure shown in FIG. 11 is identical to the structure heretofore described.

What is claimed is:

1. A rack for storing and transporting flat board-like elements of predetermined thickness, such as printed circuit boards, said rack comprising a main frame, a plurality of upright partition members mounted on said frame in uniformly spaced positions in which said partition members define a plurality of side-by-side stalls, each of said stalls being of a width slightly greater than said predetermined thickness to accommodate one of said elements in an upright position therein, element support means on said frame operable to support a plurality of said elements in upright positions in said stalls, said element support means comprising support members assembled with said partition members so as to be in fixed positions with respect to said partition members and being spaced to provide for said elements being edgewise accessible in said stalls, means operable to extend into a stall and engage the edge of an element therein for the purpose of moving said element in a direction to facilitate removal thereof from said stall, said means comprising a body member mounted on said frame for movement transversely of said stalls, said body member being pivotally mounted on said frame so that said body member is pivotally movable selectively into a plurality of said stalls, and coacting means on said body member and on said partition members operable in response to movement of said body member toward and into engagement with at least one of said partition members to advance said body member in one direction toward a succeeding stall so that repeated movement of said body member toward and away from said partition members advances said body member transversely of said stalls in one direction so that said body member is positioned in alignment after each succeeding stall to facilitate removal of an element from each of said stalls.

2. A rack according to claim 1 further including a shaft on said frame having an axis and pivotally supporting said body member, each of said partition members having an edge surface of predetermined configuration, portions of said body member on opposite sides of said shaft being engageable with said edge surfaces and being spaced apart in a direction axially of said shaft, said body member portions being configured such that movement thereof toward a partition member and into engagement with said configured edge thereof will result in the application of a force to said body member by said partition member that is parallel to said shaft axis and is of a magnitude adequate to move said body member axially of said shaft whereby continued back and forth pivotal movement of said body member to alternately engage said portions thereof with said partition member edge surfaces will cause said body member to move in one direction axially of said shaft to enable said body member to be used to facilitate removal of an element from each of said stalls.

3. A rack according to claim 1 wherein said frame has a front side and a rear side and said support means has a bottom portion which is inclined downwardly and rearwardly on said frame and a rear portion which is inclined upwardly and rearwardly on said frame.

4. Ratcheting apparatus comprising a main frame, a shaft support mounted on said frame and having an axis, a plurality of spaced stationary members on said frame extending generally perpendicular to said shaft axis, each of said members having an edge surface of predetermined configuration, a body member slidable axially on said shaft and pivotally movable on said shaft between positions in which edge surfaces of said body member on opposite sides of said shaft are engageable with said stationary member edge surfaces, said body member edge surfaces being configured such that in response to pivotal movement of said body member in either direction one of said edge surfaces thereon is movable into engagement with said configured edge surface of one of said stationary members and continued pivotal movement of said body member in the same direction will result in the application of a force to said body member by said stationary member which has a component that is parallel to said shaft axis whereby continued back and forth pivotal movement of said body member to alternately engage said edge surfaces on opposite sides thereof with said stationary member edge surface will cause said body member to move in one direction axially of said shaft.

5. Ratcheting apparatus according to claim 4 wherein one of said edge surfaces on said stationary and body members is inclined with respect to said shaft axis and said body member edge surfaces on opposite sides of said shaft are offset in a direction axially of said shaft.

6. Ratcheting apparatus according to claim 4 wherein said edge surfaces on both said stationary and body members are inclined relative to said shaft axis.

7. Ratcheting apparatus according to claim 6 further including lever means pivotally mounted on said frame and connected to said body member, said lever means being operable to provide for back and forth pivotal movement of said body member on said frame to alternate engage the edge surfaces thereon with said stationary member surfaces, and foot pedal means attached to said lever means.

* * * * *